United States Patent
Halle et al.

(10) Patent No.: US 7,749,903 B2
(45) Date of Patent: Jul. 6, 2010

(54) GATE PATTERNING SCHEME WITH SELF ALIGNED INDEPENDENT GATE ETCH

(75) Inventors: Scott D. Halle, Hopewell Junction, NY (US); Matthew E. Colburn, Schenectady, NY (US); Bruce B. Doris, Brewster, NY (US); Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 195 days.

(21) Appl. No.: 12/027,444

(22) Filed: Feb. 7, 2008

(65) Prior Publication Data
US 2009/0203200 A1    Aug. 13, 2009

(51) Int. Cl.
*H01L 21/44* (2006.01)
(52) U.S. Cl. .................. 438/671; 438/669; 438/717; 438/734; 257/E21.232; 257/E21.233
(58) Field of Classification Search .......... 438/218, 438/199, 734, 231, 232, 275, 717, 736, 587, 438/671, 669; 257/E21.232, E21.233
See application file for complete search history.

(56) References Cited

U.S. PATENT DOCUMENTS

| | | | | |
|---|---|---|---|---|
| 5,981,398 A | * | 11/1999 | Tsai et al. | 438/710 |
| 6,057,078 A | * | 5/2000 | Cunningham et al. | 430/269 |
| 6,232,162 B1 | * | 5/2001 | Kao | 438/199 |
| 7,557,024 B2 | * | 7/2009 | Rhodes | 438/587 |
| 2009/0236310 A1 | * | 9/2009 | Linder et al. | 216/49 |

* cited by examiner

*Primary Examiner*—Julio J Maldonado
(74) *Attorney, Agent, or Firm*—Yuanmin Cai; Howard Cohn

(57) ABSTRACT

A method for self-aligned gate patterning is disclosed. Two masks are used to process adjacent semiconductor components, such as an nFET and pFET that are separated by a shallow trench isolation region. The mask materials are chosen to facilitate selective etching. The second mask is applied while the first mask is still present, thereby causing the second mask to self align to the first mask. This avoids the undesirable formation of a stringer over the shallow trench isolation region, thereby improving the yield of a semiconductor manufacturing operation.

19 Claims, 6 Drawing Sheets

GATE PATTERNING SCHEME WITH SELF ALIGNED INDEPENDENT GATE ETCH

FIELD OF THE INVENTION

The present invention relates to semiconductor fabrication process, and more particularly relates to a semiconductor fabrication process that eliminates undesired stringer formations.

BACKGROUND OF THE INVENTION

As the trend of miniaturization in the field of semiconductor manufacturing continues, new challenges arise in maintaining acceptable productions yields. In particular, many semiconductor devices such as SRAM devices rely on complimentary components, that is, components that must be processed (e.g. doped) separately within a device. One such example would be nFET and pFET transistors, which are implanted with different species during the semiconductor fabrication process. The nFET and pFET devices are typically separated by a shallow trench isolation (STI) region. For the purposes of improving the circuit density, it is desirable to minimize the width of the STI region. However, as the width of the STI region decreases, there is a greater chance for an unintended polysilicon stringer to form above the STI region, thereby electrically shorting the components on each side of the STI region, and causing a fatal defect within the semiconductor device. Therefore, what is needed is a semiconductor fabrication process overcomes these issues, while not requiring an increase in the width of the STI region.

SUMMARY OF THE INVENTION

According to the present invention, a method is provided for processing complimentary components within a semiconductor device, wherein the complimentary components are comprised of a first component and a second component, comprising the steps of: applying a first mask layer over polysilicon on the first component;

processing the second component;

applying a complimentary mask layer over the second component;

removing the first mask layer; removing the polysilicon over the first component; processing the first component; and removing the complimentary mask layer, thereby processing the first and second components without the formation of a stringer.

Additionally, according to the present invention, a method is provided wherein the step of applying a complimentary mask layer comprises the step of performing a deposition process followed by the step of performing a planarizing process.

Still further, according to the present invention, a method is provided wherein the step of performing the deposition process comprises Chemical Vapor Deposition.

Still further, according to the present invention, a method is provided wherein the step of performing the deposition process comprises Physical Vapor Deposition.

Still further, according to the present invention, a method is provided wherein the step of performing the deposition process comprises Atomic Layer Deposition.

Still further, according to the present invention, a method is provided wherein the step of performing the deposition process comprises electroless plating.

Still further, according to the present invention, a method is provided wherein the step of performing the deposition process comprises electrochemical plating.

Still further, according to the present invention, a method is provided wherein the step of performing the planarizing process comprises a technique selected from the group consisting of reflow, spincoating, and planarizing.

Still further, according to the present invention, a method is provided wherein the step of removing the complimentary mask layer comprises performing a solvent strip process.

Still further, according to the present invention, a method is provided wherein the step of removing the complimentary mask layer comprises performing a plasma etch process.

Additionally, according to the present invention, a method is provided wherein the step of removing the complimentary mask layer comprises performing a chemical etch process.

Additionally, according to the present invention, a method is provided wherein the step of removing the complimentary mask layer comprises performing a thermal degradation process.

Additionally, according to the present invention, a method is provided wherein the step of applying a first mask layer comprising applying a mask layer comprised of resist, and the step of applying a complimentary mask layer comprises applying a mask layer comprised of a material selected from the group consisting of methyl vinyl ketone (MVK), poly-methacrylic acid (PMAA), silsesqioxane (SSQ), polyallylamine (PAA), and hexafluoroalcohol (HFA).

Still further, according to the present invention, a method is provided wherein the step of applying a first mask layer comprising applying a mask layer comprised of resist, and the step of applying a complimentary mask layer comprises applying a mask layer comprised of a material selected from the group consisting of carbosiline and polyborane.

Also according to the present invention, a method is provided for processing a complimentary transistor pair, wherein the complimentary transistor pair comprises an nFET and a pFET, the nFET and the pFET being separated by a shallow trench isolation region, comprising the steps of:

applying a first mask layer over polysilicon on the nFET, such that the first mask layer overlaps a portion of the shallow trench isolation region;

implanting the pFET;

applying a complimentary mask layer over the pFET, such that the complimentary mask layer is self aligned with the first mask layer;

removing the first mask layer;

removing the polysilicon over the nFET;

implanting the nFET; and removing the complimentary mask layer, thereby processing the complimentary transistor pair without the formation of a stringer.

Additionally, according to the present invention, a method is provided wherein the step of applying a complimentary mask layer comprises applying a mask layer comprised of a material selected from the group consisting of methyl vinyl ketone (MVK), poly-methacrylic acid (PMAA), silsesqioxane (SSQ), polyallylamine (PAA), and hexafluoroalcohol (HFA).

Additionally, according to the present invention, a method is provided wherein the step of removing the first mask layer comprises performing a chemical etch process.

Additionally, according to the present invention, a method is provided wherein the step of applying a complimentary mask layer over the pFET comprises Physical Vapor Deposition.

Additionally, according to the present invention, a method is provided wherein the step of applying a complimentary mask layer over the pFET comprises Chemical Vapor Deposition.

Additionally, according to the present invention, a method is provided wherein the step of removing the complimentary mask layer over the pFET comprises performing a plasma etch process.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity. Block diagrams may not illustrate certain connections that are not critical to the implementation or operation of the present invention, for illustrative clarity.

Figure 1A:
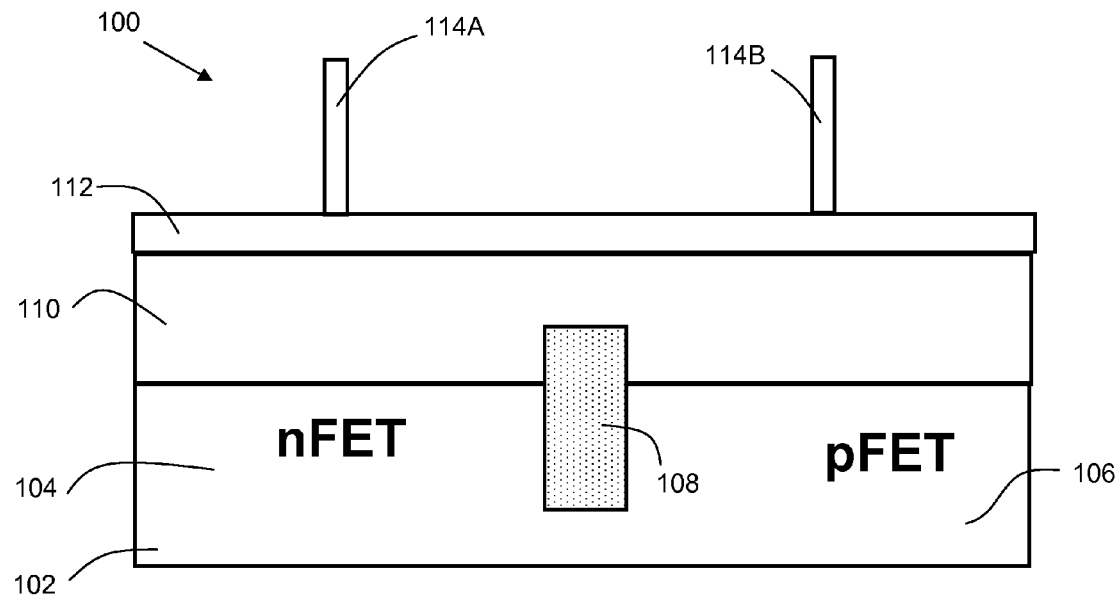

In the drawings accompanying the description that follows, often both reference numerals and legends (labels, text descriptions) may be used to identify elements. If legends are provided, they are intended merely as an aid to the reader, and should not in any way be interpreted as limiting.

Often, similar elements may be referred to by similar numbers in various figures (FIGs) of the drawing, in which case typically the last two significant digits may be the same, the most significant digit being the number of the drawing figure (FIG).

FIGS. 1A-1F illustrate prior art semiconductor fabrication steps.

FIGS. 2A-2D illustrate semiconductor fabrication steps of the present invention.

Figure 3:
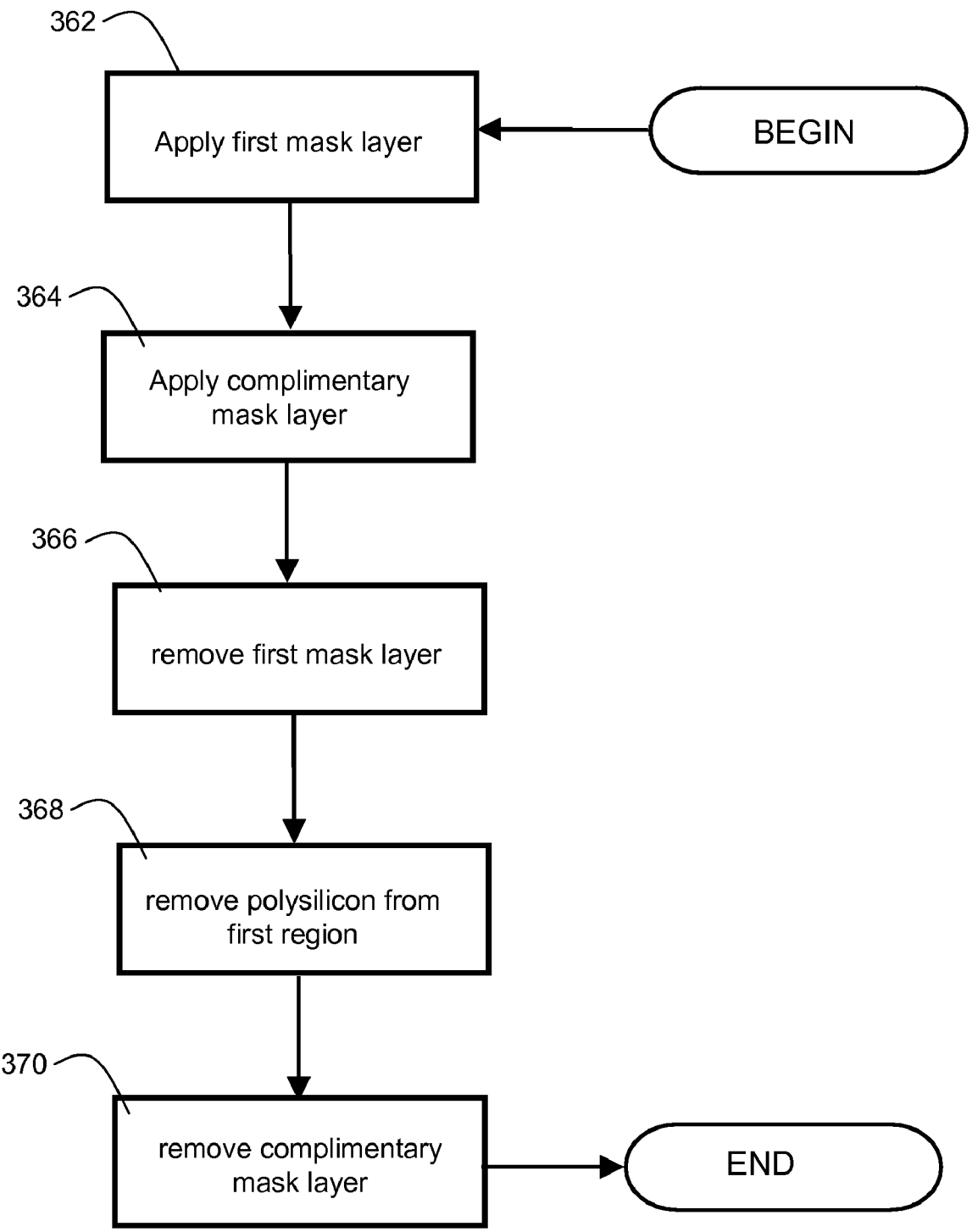

FIG. 3 is a flowchart indicating process steps of the present invention.

DETAILED DESCRIPTION

For the purposes of providing background, the relevant prior art semiconductor fabrication steps will be briefly described in FIGS. 1A-1F. Note that some layers in these cross-sectional views may be omitted for clarity, if they are not pertinent to the present invention.

Referring now to FIG. 1A, a portion of a semiconductor device 100 is shown. Semiconductor device 100 comprises a silicon substrate 102. The substrate 102 comprises an nFET region 104 (corresponding to an nFET component) and a pFET region 108 (corresponding to a pFET component), that are separated from each other by a shallow trench isolation (STI) region 108. The STI region 108 is filled with a deposited dielectric. Above the substrate 102 is a layer of polysilicon 110. Note that in practice, there may be multiple layers between substrate 102 and polysilicon layer 110, such as metal layers, gate oxides, and additional polysilicon layers. These layers are known in the art, but are eliminated from these drawings for the sake of clarity. Above polysilicon layer 110 is a hardmask layer 112. Above the hardmask layer, two resist images 114A and 114B are shown. Resist images 114A and 114B may be formed via well-known lithographic methods.

Figure 1B:
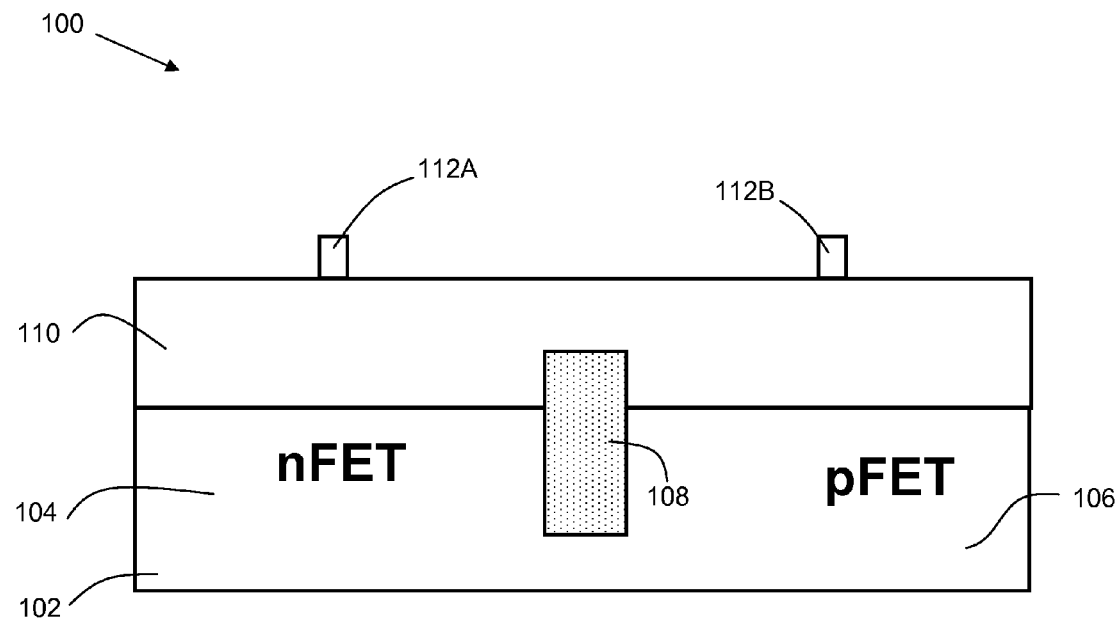

FIG. 1B shows semiconductor device 100 after the process steps of removing the hardmask 112, typically via an etch process. The hardmask only remains where it was protected by the resist images (114A and 114B of FIG. 1A). Once the hardmask is removed, the resist images are also removed, leaving two hardmask areas 112A and 112B.

Figure 1C:
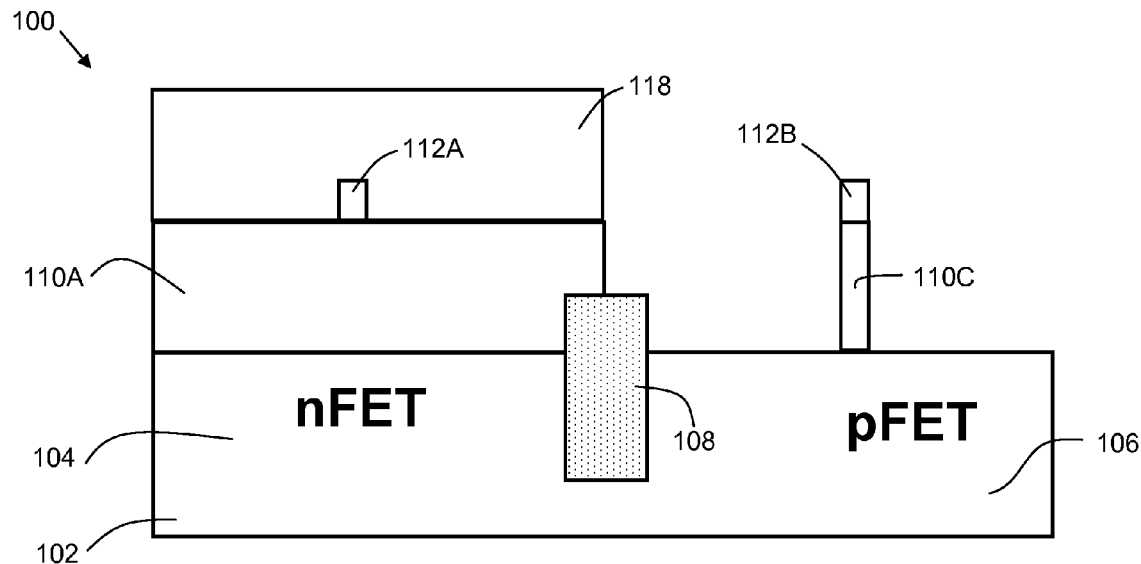

FIG. 1C shows semiconductor device 100 after the process steps of applying mask layer 118 over the polysilicon 110, removing the mask layer 118 from the area above the pFET region 106 (via lithography) and removing the polysilicon 110 from the area above the pFET region 106, leaving only polysilicon portion 110C (which was protected by hardmask 112B) above the pFET region 106, as part of the so-called "gate stack" for the pFET. This step also leaves the polysilicon portion 110A intact, above the nFET region 104. At this point in the fabrication process, the pFET region 106 is typically implanted with the desired species, while the nFET is protected by mask layer 118.

Figure 1D:
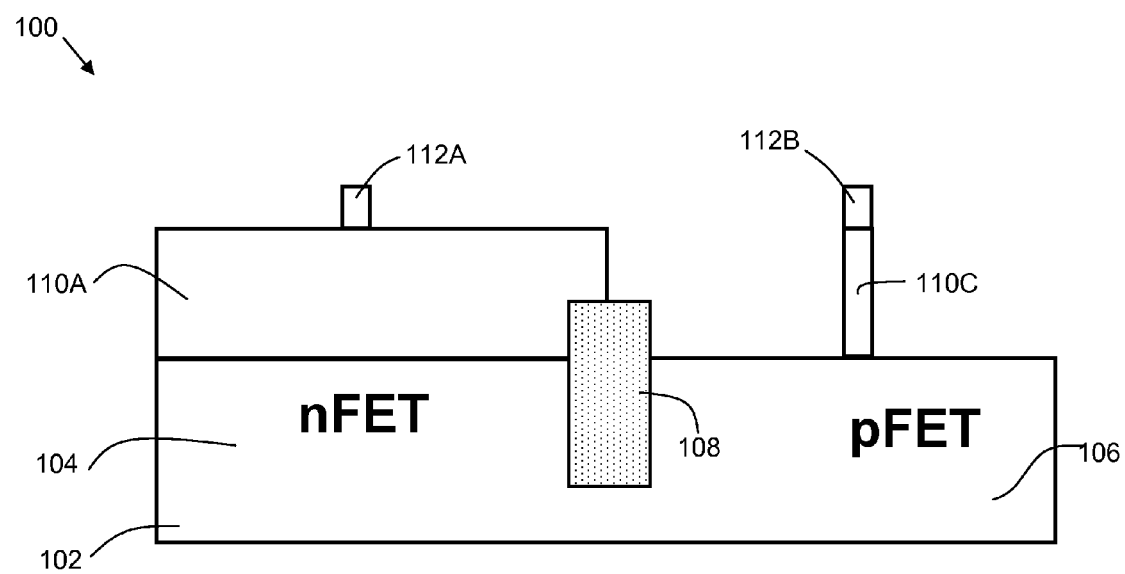

FIG. 1D shows semiconductor device 100 after the process steps of removing mask layer 118, in preparation for processing the nFET region 104. However, before processing the nFET region 104, the pFET region 106 must be protected by applying pFET mask 122 over the pFET via lithographic methods, as is shown in FIG. 1E.

Figure 1E:
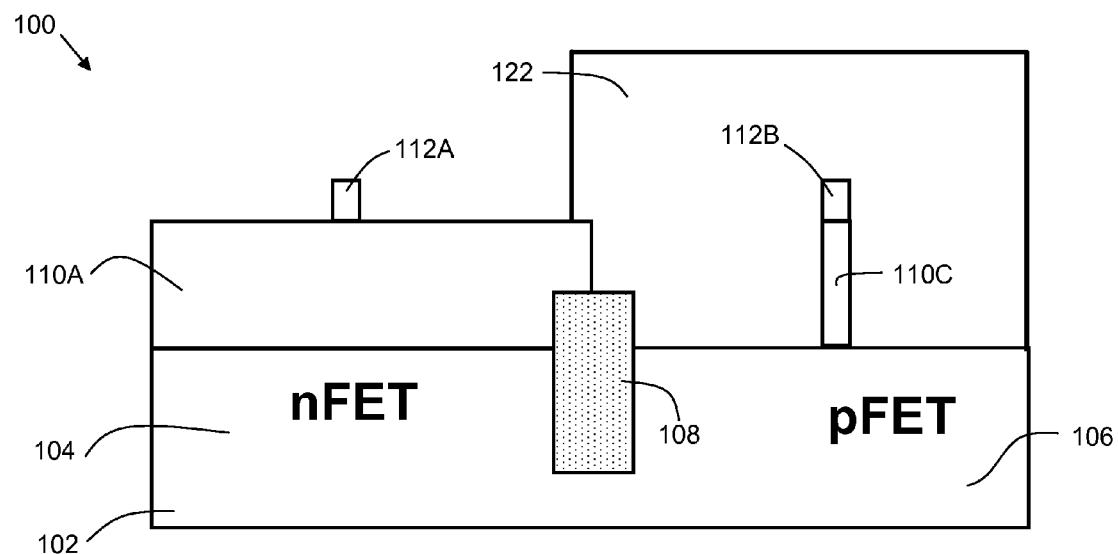

Still referring to FIG. 1E, it is shown that pFET mask 112 may unintentionally overlap polysilicon region 110A, as is highlighted by region 124. Overlap 124 is undesirable, because when polysilicon region 110A is removed, a stringer is formed in the area below the overlap 124.

Figure 1F:
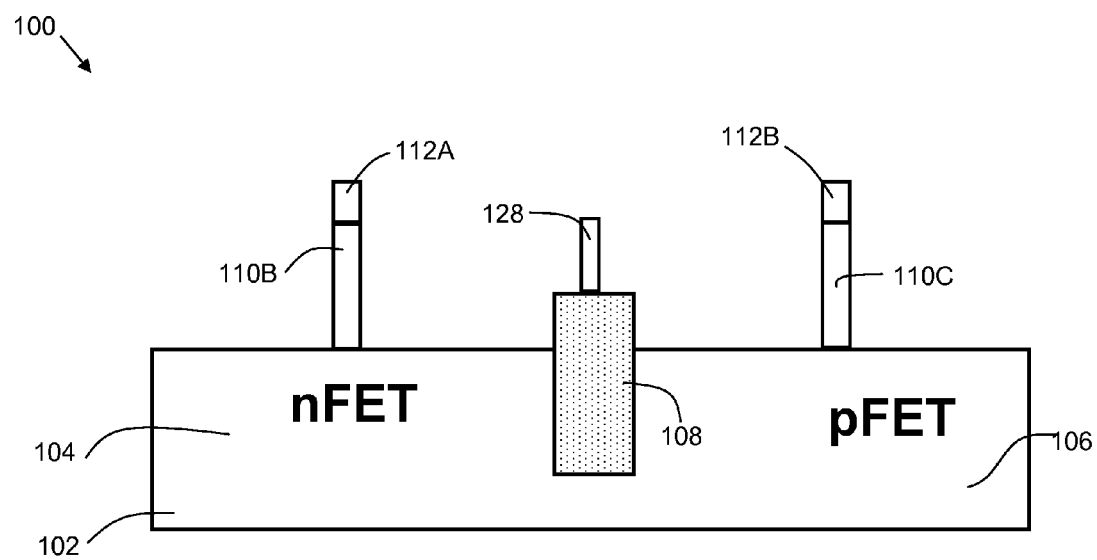

FIG. 1F shows semiconductor device 100 after the process step of removing the polysilicon layer 110A, leaving only polysilicon area 10B, which forms part of the nFET "gate stack", and polysilicon portion 128, which is known in the industry as a "stringer." The stringer 128 is formed because it was protected by the pFET mask during the polysilicon removal process. This is followed by the process step of removing the pFET mask 122. Due to the overlap (124 of FIG. 1E), a polysilicon stringer 128 was formed over the STI region 108. The polysilicon stringer serves to electrically short the nFET and pFET devices of the finished semiconductor product, often rendering a fatal defect in it.

Having now described the prior art process, and illustrating the problem of stringer formation that is inherent with it, the present invention will now be described in the following figures.

FIGS. 2A-2D illustrate semiconductor fabrication steps of the present invention.

Figure 2A:
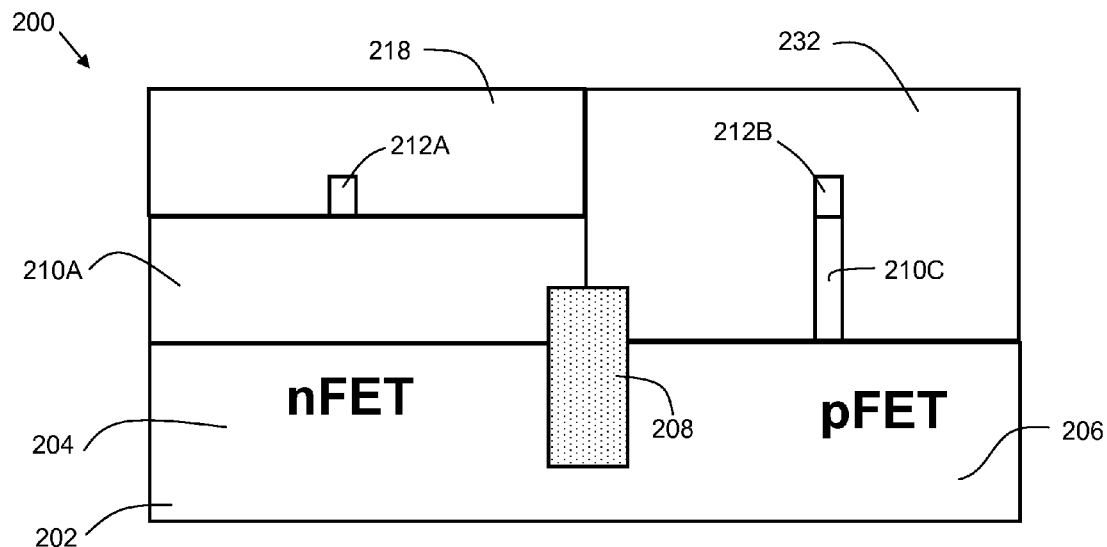

Referring now to FIG. 2A, a portion of a semiconductor device 200 is shown. Note that similar elements may be referred to by similar numbers in which case, typically the last two significant digits may be the same. For example, silicon substrate 202 of FIG. 2A is similar to silicon substrate 102 of FIG. 1A.

FIG. 2A starts after FIG. 1C of the prior art process that was described previously. In FIG. 2A, a complimentary mask 232 is applied above pFET region 206 prior to removal of mask layer 218, serving to protect pFET region 206. This is in contrast to the prior art process illustrated in FIG. 1D, where the mask layer 118 is removed prior to protection the pFET region 106.

Because the polysilicon layer 210A and mask layer 218 are both present when the complimentary mask 232 is applied, the complimentary mask 232 "self aligns" to the nFET layers (210A and 218) and the possibility of overlap (see 124 of FIG.

1E) is eliminated. The complimentary mask preferably has good planarizing characteristics such that it can be applied, and then planarized to be flush with the nFET layers (210A and 218) as is shown in FIG. 2A. The planarizing of the complimentary mask 232 can be accomplished with various techniques, including, but not limited to, reflow, controlled deposition, and spincoating.

There are various suitable techniques for applying the complimentary mask, including, but not limited to, CVD (Chemical Vapor Deposition), PVD (Physical Vapor Deposition), iPVD (Ionized Physical Vapor Deposition), plating (electroless, electrochemical), spincoating, and evaporation. ALD (Atomic Layer Deposition) may also be used.

Figure 2B:
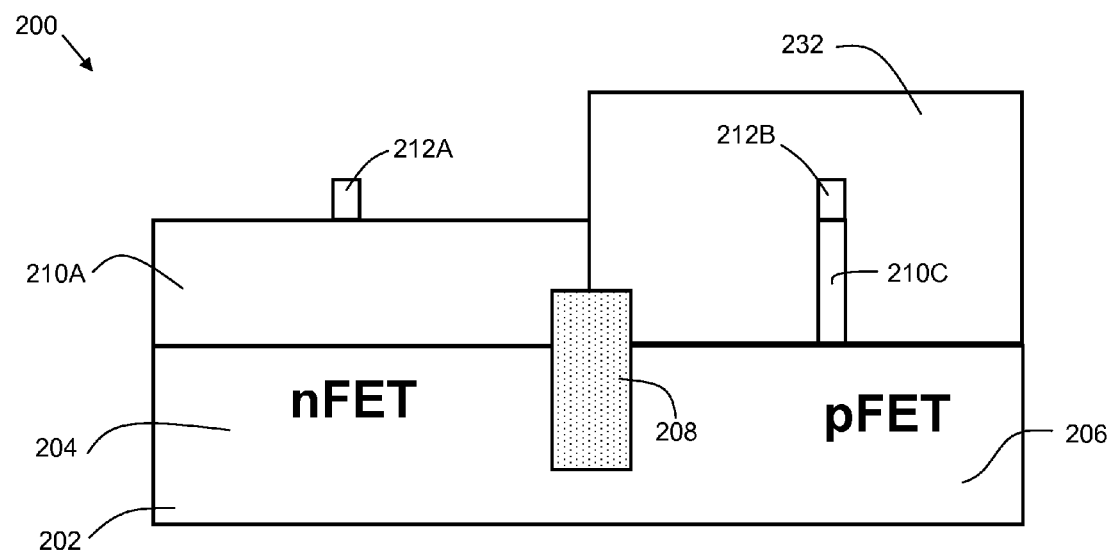

FIG. 2B shows semiconductor device 200 after the process step of removing mask layer 218, in preparation for processing the nFET region 204. Protection of pFET region 206 is already in place via complimentary mask 232.

Figure 2C:
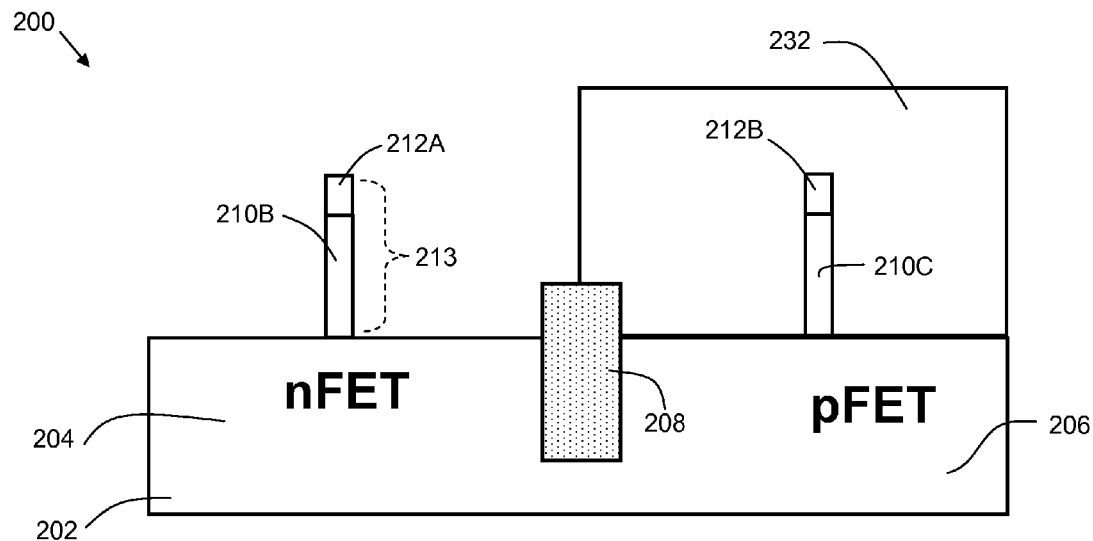

FIG. 2C shows semiconductor device 200 after the process steps of removing the polysilicon layer 210A, leaving only polysilicon region 210B, as part of the nFET "gate stack," shown as reference 213. The nFET region 204 may then be implanted with the desired species while the pFET region 206 is protected by complimentary mask 232.

Figure 2D:
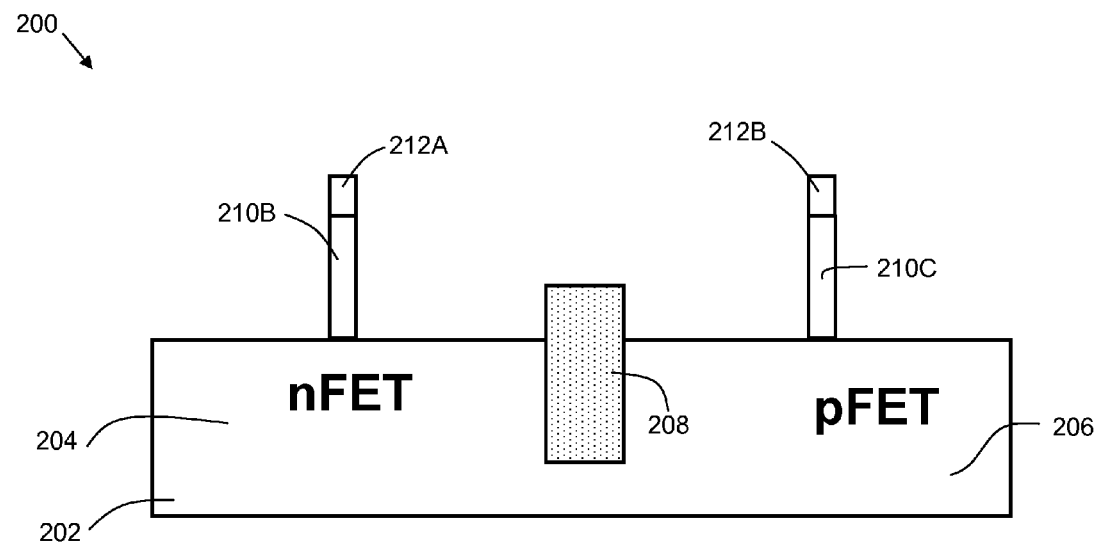

FIG. 2D shows semiconductor device 200 after the process step of removing complimentary mask 232. Various methods may be used to remove complimentary mask 232, including, but not limited to, solvent strip, plasma etch, wet chemical etch, thermal degradation, UV degradation, or combinations thereof. The present invention achieves the desired result of having no stringer over the STI region 208 (compare with 128 of FIG. 1F).

There is a relationship between complimentary mask 232 and mask layer 218 that is preferable for use with the present invention. The mask layer 218 is chosen to be selectively etched with respect to complimentary mask 232. Selective etch techniques are well known in the art. The selectivity of removal between mask layer 218 and complimentary mask 232 is preferably of a ratio ranging from 1:2 to 1:10. With these selectivity ratios, the mask layer 218 is able to be etched at a much faster rate than the complimentary mask 232. This allows the mask layer 218 to be removed without removing the complimentary mask 232. The complimentary mask 232 preferably has the property of being strippable without impacting the gate profile or gate oxide layer of the device it is protecting.

There are a variety of possible combinations of materials that may be used to achieve the desired selectivity. Selective etching is known in the art, and techniques for selective etching are disclosed in various references, such as U.S. Pat. No. 4,869,777, which is incorporated by reference herein. In an exemplary embodiment, the mask layer 218 may be organic, and the complimentary mask can be chosen as silicon based. In this case, a chemical etch can be used to remove the organic material at a much faster rate than the inorganic (silicon based) materials.

For example, considering the case of a mask 218 comprised of an organic resist, and an inorganic complimentary mask 232 which is comprised of SSQ, polyborane, or silane derivatives. In one embodiment of the present invention, the organic resist is etched in O2 and H2 plasmas, selective solvents, or thermally degraded relative to the complimentary mask 232 comprised of the inorganic material (SSQ, polyborane, or silane derivatives).

Materials that can be used for the mask 218 or complimentary mask 232 include, but are not limited to, methyl vinyl ketone (MVK), poly-methacrylic acid (PMAA), silsesqioxane (SSQ), polyallylamine (PAA), and hexafluoroalcohol (HFA). Resists may also be used to form the mask 218. Resists typically contain aliphatic and/or aromatic resins (dependent on the wavelength), photoactive compounds such as chromophores, photoacids, and quenchers. Other components such as surfactants and plasticizers are also common.

The table below illustrates some combinations that may be used. The table below is intended to be exemplary, and not intended to be limiting. Other materials may be used, so long as they exhibit the desired selectivity properties.

| mask material (218) | Complimentary mask material (232) | Selectivity | Chemistries |
| --- | --- | --- | --- |
| Organic | Inorganic | H2, O2 plasma, solvent strip, thermal | Resist/SSQ, Carbosilane, polyborane, silane derivative |
| Organic | Organic | Solvent, thermal, UV | Resist/ P(a-Methyl styrene), PMMA-MVK, PMAA, PAA, HFA-derivate (alcohol soluable). |
| Inorganic | Organic | H2, O2 plasma, solvent strip, thermal, UV | SSQ/planarizing organic ARC |
| Inorganic | Inorganic | Solvent, Acid/Base | Alcohol soluable (SSQ)/alcohol insoluable (polycarbosilane) |

FIG. 3 is a flowchart indicating process steps of the present invention. In process step 362, a first mask layer is deposited on the semiconductor device. This corresponds to the deposition of mask layer 218 in FIG. 2A. In process step 364, a complimentary mask layer is deposited. This corresponds to the deposition of complimentary mask layer 232 in FIG. 2A. In process step 366, the first mask layer is removed. This results in the semiconductor device shown in FIG. 2B (note the absence of layer 218). In process step 368, the polysilicon is removed from the first region. This results in the semiconductor device shown in FIG. 2C (note the absence of layer 210A). Finally, in step 370, the complimentary mask layer is removed. This results in the semiconductor device shown in FIG. 2D (note the absence of layer 232), wherein no stringer is formed over the STI region (208 of FIG. 2D).

As can be seen from the aforementioned description, the present invention provides an improved method for patterning in a semiconductor fabrication process, and serves to promote continued high reliability for semiconductor devices and circuits.

It will be understood that the present invention may have various other embodiments. Furthermore, while the form of the invention herein shown and described constitutes a preferred embodiment of the invention, it is not intended to illustrate all possible forms thereof. It will also be understood that the words used are words of description rather than limitation, and that various changes may be made without departing from the spirit and scope of the invention disclosed. Thus, the scope of the invention should be determined by the appended claims and their legal equivalents, rather than solely by the examples given.

What is claimed is:

1. A method for processing complimentary components within a semiconductor device wherein the complimentary components are comprised of a first component and a second component comprising the steps of:
   applying a first mask layer over of silicon on the first component;
   processing the second component;
   applying a complimentary mask layer over the second component;
   removing the first mask layer;
   removing the polysilicon over the first component;
   processing the first component;
   removing the complimentary mask layer thereby processing the first and second components without the formation of a stringer: and
   wherein the step of applying a complimentary mask layer comprises the step of performing a deposition process followed by the step of performing a planarizing process.

2. The method of claim 1, wherein the step of performing the deposition process comprises Chemical Vapor Deposition.

3. The method of claim 1, wherein the step of performing the deposition process comprises Physical Vapor Deposition.

4. The method of claim 1, wherein the step of performing the deposition process comprises Atomic Layer Deposition.

5. The method of claim 1, wherein the step of performing the deposition process comprises electroless plating.

6. The method of claim 1, wherein the step of performing the deposition process comprises electrochemical plating.

7. The method of claim 1, wherein the step of performing the planarizing process comprises a technique selected from the group consisting of reflow, spincoating, and planarizing.

8. The method of claim 1 wherein the step of removing the complimentary mask layer comprises performing a solvent strip process.

9. The method of claim 1 wherein the step of removing the complimentary mask layer comprises performing a plasma etch process.

10. The method of claim 1 wherein the step of removing the complimentary mask layer comprises performing a chemical etch process.

11. The method of claim 1 wherein the step of removing the complimentary mask layer comprises performing a thermal degradation process.

12. The method of claim 1, wherein the step of applying a first mask layer comprising applying a mask layer comprised of resist, and the step of applying a complimentary mask layer comprises applying a mask layer comprised of a material selected from the group consisting of methyl vinyl ketone (MVK), poly-methacrylic acid (PMAA), silsesqioxane (SSQ), polyallylamine (PAA), and hexafluoroalcohol (HFA).

13. The method of claim 1, wherein the step of applying a first mask layer comprising applying a mask layer comprised of resist, and the step of applying a complimentary mask layer comprises applying a mask layer comprised of a material selected from the group consisting of carbosiline and polyborane.

14. A method for processing a complimentary transistor pair, wherein the complimentary transistor pair comprises an nFET and a pFET, the nFET and the pFET being separated by a shallow trench isolation region, comprising the steps of:
   applying a first mask layer over polysilicon on the nFET, such that the first mask layer overlaps a portion of the shallow trench isolation region;
   implanting the pFET;
   applying a complimentary mask layer over the pFET, such that the complimentary mask layer is self aligned with the first mask layer;
   removing the first mask layer;
   removing the polysilicon over the nFET;
   implanting the nFET; and
   removing the complimentary mask layer, thereby processing the complimentary transistor pair without the formation of a stringer.

15. The method of claim 14, wherein the step of applying a complimentary mask layer comprises applying a mask layer comprised of a material selected from the group consisting of methyl vinyl ketone (MVK), poly-methacrylic acid (PMAA), silsesqioxane (SSQ), polyallylamine (PAA), and hexafluoroalcohol (HFA).

16. The method of claim 14 wherein the step of removing the first mask layer comprises performing a chemical etch process.

17. The method of claim 14, wherein the step of applying a complimentary mask layer over the pFET comprises Physical Vapor Deposition.

18. The method of claim 14, wherein the step of applying a complimentary mask layer over the pFET comprises Chemical Vapor Deposition.

19. The method of claim 14 wherein the step of removing the complimentary mask layer comprises performing a plasma etch process.

* * * * *